US006187483B1

(12) United States Patent
Capodieci et al.

(10) Patent No.: US 6,187,483 B1
(45) Date of Patent: Feb. 13, 2001

(54) MASK QUALITY MEASUREMENTS BY FOURIER SPACE ANALYSIS

(75) Inventors: Luigi Capodieci; Christopher A. Spence, both of Sunnyvale, CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 09/322,546

(22) Filed: May 28, 1999

(51) Int. Cl.$^7$ ........................................ G03F 9/00

(52) U.S. Cl. ........................... 430/5; 395/500.21

(58) Field of Search .................... 430/5, 322; 355/53; 716/20; 395/500.2, 500.21

(56) References Cited

U.S. PATENT DOCUMENTS 5,331,370 7/1994 Rosner et al. ...................... 355/53
5,991,006 * 11/1999 Tsudaka ............................. 355/53

OTHER PUBLICATIONS

"An Introduction to Wavelets", on the Internet at http://www.amara.com/IEEEwave/*.*, Feb. 16, 1999, 15 pages.

"The Wavelet Tutorial" The Engineer's Ultimate Guide to Wavelet Analysis by Robi Polikar, on the Internet at http://www.public.iastate.edu/~rpolikar/Wavelets/*.*, Feb. 16, 1999, 75 page.

* cited by examiner

Primary Examiner—S. Rosasco
(74) Attorney, Agent, or Firm—Amin, Eschweiler & Turocy, LLP

(57) ABSTRACT

A method (200) of determining an optimal mask fabrication process includes fabricating (202) a first mask pattern (220) on a mask using a first mask fabrication process and a second mask pattern (222) on a mask using a second mask fabrication process, wherein each mask pattern approximates an ideal pattern. The method (200) further includes performing a mathematical transform on the first and second mask patterns (230), wherein the mathematical transform provides a representation of the first and second mask patterns as sums of functions. A metric is then obtained for the transformed mask patterns (220, 222), wherein the metric is based upon a capability of a pattern transfer system which will utilize the masks employing the first and second mask patterns one of the first and second mask fabrication processes is selected (236) based upon an application of the metric to the first and second sum of orthogonal functions, thereby selecting the one of the first or second mask fabrication processes that provides for a better mask pattern which most closely approximates the ideal mask pattern.

19 Claims, 12 Drawing Sheets

MASK QUALITY MEASUREMENTS BY FOURIER SPACE ANALYSIS

FIELD OF THE INVENTION

The present invention generally relates to photolithography process development, and more particularly relates to a method of selecting one of various available mask fabrication processes based upon an application of a metric to a two-dimensional Fourier space representation of mask patterns which are manufactured by the various mask fabrication processes and using the metric to select a particular mask fabrication process.

BACKGROUND OF THE INVENTION

The minimum feature sizes of integrated circuits are continuously decreasing in order to increase the packing density of the various semiconductor devices formed thereby. With this size reduction, however, various steps within the integrated circuit fabrication process become more difficult. One such area within the semiconductor fabricating process which experiences unique challenges as feature sizes shrink is photolithography.

Photolithography involves selectively exposing regions of a resist-coated silicon wafer to form a radiation pattern thereon. Once exposure is complete, the exposed resist is developed in order to selectively expose and protect the various regions on the silicon wafer defined by the exposure pattern (e.g., silicon regions in the substrate, polysilicon on the substrate, or insulating layers such as silicon dioxide).

An integral component of a photolithography or pattern transfer system is a reticle (often called a mask) which includes a pattern thereon corresponding to features to be formed in a layer on the substrate. A reticle typically includes a transparent glass plate covered with a patterned light blocking material such as chrome. The reticle is placed between a radiation source producing radiation of a pre-selected wavelength (e.g., ultraviolet light) and a focusing lens which may form part of a stepper apparatus. Placed beneath the stepper is the resist-covered silicon wafer. When the radiation from the radiation source is directed onto the reticle, light passes through the glass (in the regions not containing the chrome mask patterns) and projects onto the resist-covered silicon wafer. In this manner, an image of the reticle is transferred to the resist.

The resist (sometimes referred to as the "photoresist") is provided as a thin layer of radiation-sensitive material that is typically spin-coated over the entire silicon wafer surface. The resist material is classified as either positive or negative depending on how it responds to the light radiation. Positive resist, when exposed to radiation becomes more soluble and is thus more easily removed in a development process. As a result, a developed positive resist contains a resist pattern corresponding to the dark regions on the reticle. Negative resist, in contrast, becomes less soluble when exposed to radiation. Consequently, a developed negative resist contains a pattern corresponding to the transparent regions of the reticle. For simplicity, the following discussion will describe only positive resists, but it should be understood that negative resists may be substituted therefor.

An exemplary prior art reticle is illustrated in FIG. 1. Prior art FIG. 1 includes a reticle 10 corresponding to a desired integrated circuit pattern 12. For simplicity, the pattern 12 consists of only two design mask patterns. A clear reticle glass 14 allows radiation to project onto a resist covered silicon wafer. The chrome regions 16 and 18 on the reticle 10 block radiation to generate an image on the wafer corresponding to the desired integrated circuit design features.

As light passes through the reticle 10, it is refracted and scattered by the edges of the chrome 16 and 18. This causes the projected image to exhibit some rounding and other optical distortion. While such effects pose relatively little difficulty in layouts with large features (e.g., features with critical dimensions greater than one micron), they can not be ignored in present day circuit layouts where critical dimensions are about 0.25 micron or smaller. The problem highlighted above becomes even more pronounced in integrated circuit designs having feature sizes near the wavelength of the radiation used in the photolithographic process.

Prior art FIG. 2 illustrates the impact of the diffraction and scattering caused by the radiation passing through the reticle 10 and onto a section of a photoresist covered silicon substrate 20. As illustrated, the illumination pattern on the substrate 20 contains an illuminated region 22 and two dark regions 24 and 26 corresponding to the chrome regions 16 and 18 on the reticle 10. The illuminated pattern 22, however, exhibits considerable distortion, with the dark regions 24 and 26 having their corners 28 rounded. Unfortunately, any distorted illumination pattern propagates through the developed resist pattern and negatively impacts the integrated circuit features such as polysilicon gate regions, vias in dielectrics, etc. As a result, the integrated circuit performance is degraded.

To remedy this problem, a reticle correction technique known as optical proximity correction (OPC) has been developed. OPC involves the adding of dark regions to and/or the subtracting of dark regions from portions of a reticle to overcome the distorting effects of diffraction and scattering. Typically, OPC is performed on a digital representation of a desired integrated circuit pattern. This digital representation is often referred to as the mask layout data and is used by the reticle manufacturer to generate the reticle. First, the mask layout data is evaluated with software to identify regions where optical distortion will result. Then the OPC is applied to compensate for the distortion. The resulting pattern is ultimately transferred to the reticle glass.

Prior art FIG. 3 illustrates how OPC may be employed to modify the reticle design illustrated in FIG. 1 and thereby provide more accurately the desired illumination pattern at the substrate. As shown, an OPC-corrected reticle 30 includes two features 32 and 34 outlined in chrome on the glass plate 36. Various corrections 38 have been added to the base features. Some correction takes the form of "serifs." Serifs are typically small, appendage-type addition or subtraction regions typically made at corner regions or other areas on reticle designs.

Prior art FIG. 4 illustrates an illumination pattern 50 produced on a photoresist covered wafer surface 52 by radiation passing through the reticle 30 of prior art FIG. 3. As shown, the illuminated region includes a light region 54 surrounding a set of dark regions 56 and 58 which substantially faithfully represent the desired pattern illustrated in prior art FIG. 1. Note that the illumination pattern 22 of prior art FIG. 2 which was not produced with a reticle having OPC (reticle 10) has been improved greatly by the reticle 30 having OPC.

Although OPC designs provide performance improvements over features which do not employ OPC as illustrated in prior art FIGS. 1–4, presently there is not a usable method for determining whether one type of OPC design is better than another. That is, it is difficult to determine which OPC design is the optimal design for a given feature even with the most advanced simulation equipment. As illustrated in prior art FIG. 5, a feature 60 on a mask 62 has a core portion 64 with an OPC design 66 applied thereto. The OPC design 66, however, may include different types of serifs 68a, 68b of various dimensions at various locations about the feature 60. For example, the serif 68a may attach to the core portion 64 at various points and thus may vary substantially in its dimensions. In addition, the serif 68b may have a variable width, a variable length, and may exist at various distances away from the core portion 64. Presently, however, there is not an efficient way of evaluating whether one type of OPC design is better than another in achieving its goal, namely to produce a feature on a substrate which substantially approximates an ideal feature 70, as illustrated in prior art FIG. 6.

One prior art method for evaluating multiple OPC designs involves forming a mask having multiple mask patterns thereon, wherein each mask pattern includes the core portion and a unique OPC design. The mask is then used in a pattern transfer system to generate a plurality of features on a substrate. The plurality of generated features are then individually analyzed to see which OPC design provided a feature which most closely approximated the intended ideal feature. This prior art method, however, is undesirable because it involves a time-consuming and expensive evaluation process. For example, a test mask must be generated and features must be formed on a substrate using a pattern transfer system according to conventional techniques. Then, each generated feature must be individually measured at numerous points and compared according to a set of criteria to determine which is the best OPC design. Clearly such a process is disadvantageously expensive and time-consuming. In addition, such an evaluation process is only valid for the one particular feature of interest; additional such evaluations would be necessary in order to evaluate different features. Lastly, the OPC design evaluation process is only valid for the particular pattern transfer system which was used in the evaluation. Therefore the replacement or modification of the pattern transfer system would render the earlier OPC design evaluation of doubtful value and another OPC design evaluation process would most likely be required to ensure that the optimal OPC design will be employed for a given feature.

Another problem associated with the implementation of OPC designs for a given feature is the mask fabrication process which is employed in fabricating the mask. As illustrated in prior art FIG. 7, a portion of mask layout data associated with a core feature 80 having an OPC design 82 is used to generate a pattern on a mask (i.e., a mask pattern). As illustrated in prior art FIG. 7, different mask fabrication processes for a given feature result in mask patterns that approximate the intended feature having the OPC, but nevertheless differ from one another. For example, the mask pattern 86 formed by the mask fabrication process A of prior art FIG. 7 may have been generated using a dry etch while the mask pattern 88 formed by the mask fabrication process B may have been generated using a wet etch which caused the mask patterns 86 and 88 to differ. Given the fact that different mask fabrication processes provide mask patterns which approximate the intended OPC design, but differ from one another, one must evaluate which mask fabrication process is the optimal process to utilize in order to maximize the benefits provided by OPC.

It is an object of the present invention to further improve upon the prior art OPC development techniques and mask fabrication techniques presently being employed.

SUMMARY OF THE INVENTION

The present invention relates to a system and method of characterizing features having optical proximity correction designs by applying a mathematical transform to the OPC designs and evaluating the transformed features with a metric which is related to the pattern transfer system. The present invention also relates to a system and method of determining an optimal mask fabrication process by applying a mathematical transform to mask patterns formed by various fabrication processes and evaluating the transformed mask patterns with a metric which is related to the pattern transfer system.

According to one aspect of the present invention, a system and method of characterizing features having different OPC designs is provided. A plurality of features having different OPC designs form an input data set and are characterized by performing a two-dimensional Fourier transform thereon to thereby transform the input data set into the spatial frequency domain, thus resulting in a two-dimensional spatial frequency mapping for each feature. A metric is then applied to the transformed feature data. The metric preferably is related to a range of spatial frequencies which are transmitted through the pattern transfer system (i.e., the pattern transfer system can be character as a band-pass filter). Using the metric, a value which corresponds to each set of transformed feature data is calculated. More particularly, the metric preferably is used as a set of integration limits and corresponds to an area within each two-dimensional spatial frequency mapping. The value for each feature thus corresponds to an amount of feature energy within the area which will pass through the pattern transfer system to an underlying substrate. The values are then used to select the feature having the best OPC design, for example, by selecting the OPC design in which the maximum amount of feature energy is transmitted through the pattern transfer system, thus resulting in optimal feature resolution on the substrate.

According to another aspect of the present invention, a system and method for characterizing a plurality of features having different OPC designs includes performing any one of many mathematical transforms on the input data set to provide transformed feature data as sums or products of classes of functions (typically orthogonal functions). For example, a Wavelet transform may be utilized to convert the input data set into a finite sum or product of scaled and translated functions. A metric is then applied to the transformed feature data (wherein the metric is related to or correlates with a characteristic of the pattern transfer system) to obtain a value for each feature. One of the features is then selected using the values based upon a predetermined criteria to thereby select the optimal OPC design.

According to yet another aspect of the present invention, a system and method for determining an optimal mask fabrication process is disclosed. For a given feature having an OPC design, a plurality of mask patterns are generated using different mask fabrication processes, wherein each of the mask patterns approximates the feature, yet differ from one another due to the differing mask fabrication techniques. The optimal mask fabrication process is determined by applying a Fourier transform to the mask patterns (which form an input data set) to thereby generate a two-dimensional spatial frequency mapping for each mask pattern. A metric is then applied to the transformed mask pattern data, wherein the metric corresponds with or is related to a performance characteristic of the pattern transfer system. Preferably, the metric corresponds to a range of spatial frequencies which are transmitted through the pattern transfer system. The application of the metric to the transformed mask pattern data results in a value for each of the two-dimensional spatial frequency mappings, which preferably correspond to an amount of mask pattern energy transmitted through the pattern transfer system. Using the values associated with the mask patterns, the optimal mask fabrication process is selected.

According to still another aspect of the present invention, a system and method for selecting an optimal mask fabrication process is disclosed. For a given feature having an OPC design, various mask fabrication processes generate mask patterns which approximate the desired feature, yet differ in minor respects from one another due to the different fabrication techniques employed in generating the respective mask patterns. The present invention selects the optimal mask fabrication process by applying a mathematical transform to the mask features which form an input data set to thereby generate transformed mask pattern data composed of a sum or product of functions for each of the mask patterns. For example, the mathematical transform may include a Wavelet transform, wherein the transformed mask pattern data consists of a finite sum or product of scaled and translated functions. A metric, which corresponds with or is related to a performance characteristic of the pattern transfer system, is then applied to the transformed mask pattern data which results in a value for each mask pattern. Using the values for the mask patterns, one of the mask patterns, and thus its associated mask fabrication process, is selected as optimal based upon predetermined criteria.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
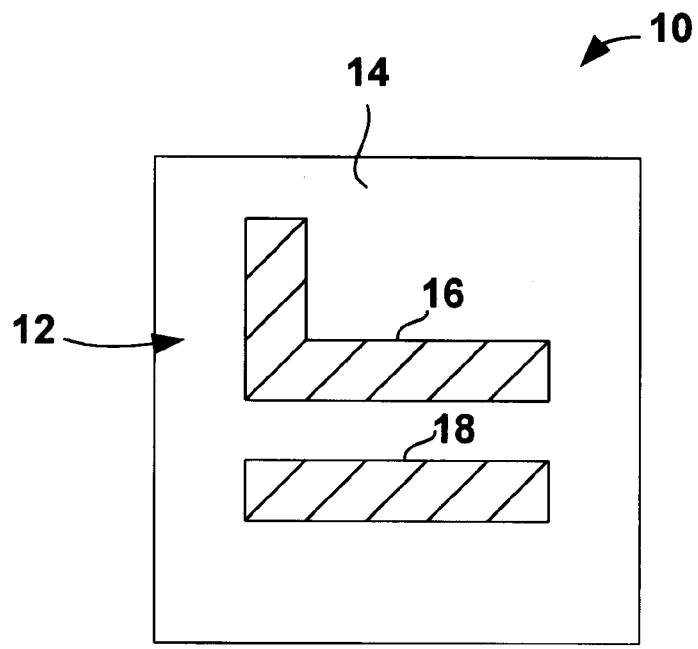
FIG. 1 is a plan view illustrating prior art mask layout data for various features.
Figure 2:
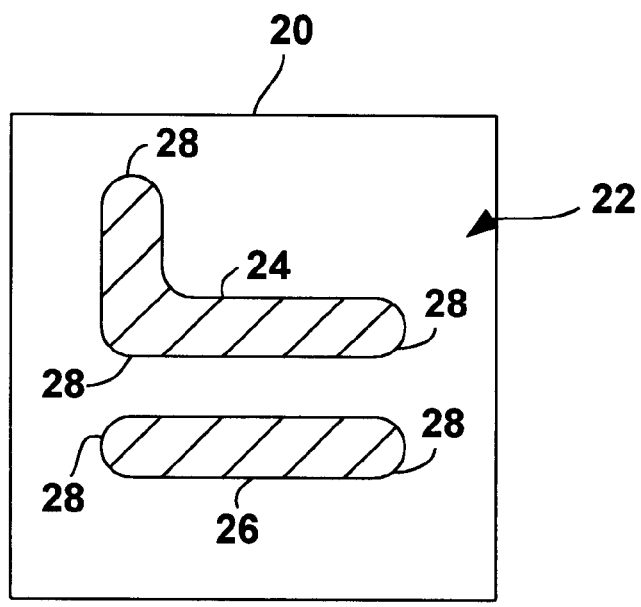
FIG. 2 is a plan view illustrating feature rounding on a substrate manufactured with a reticle having the mask layout data of FIG. 1.
Figure 3:
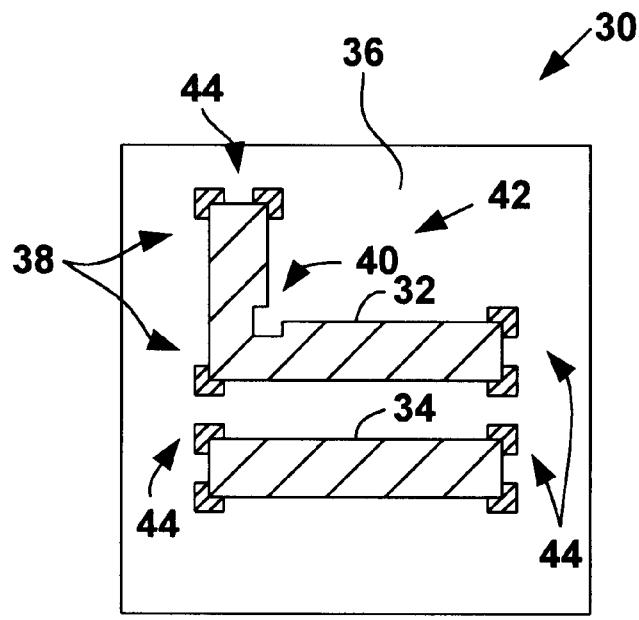
FIG. 3 is a plan view illustrating prior art mask layout data for various features employing conventional optical proximity correction.
Figure 4:
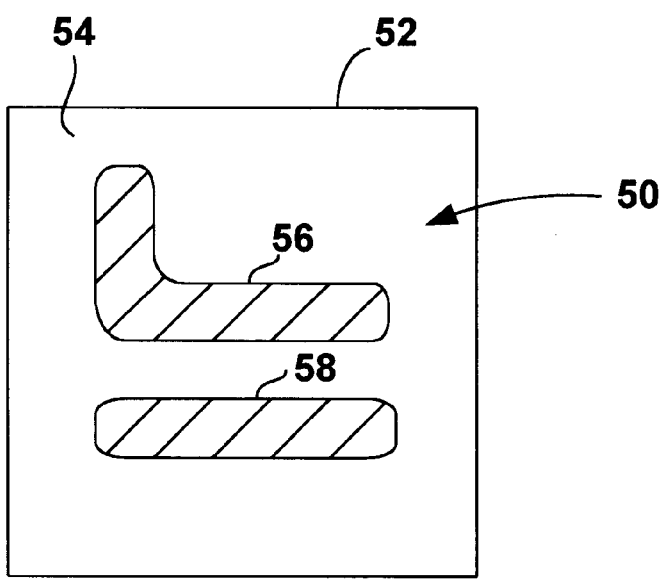
FIG. 4 is a plan view illustrating reduced feature rounding on a substrate manufactured with a reticle having the mask layout data of FIG. 3.
Figure 5:
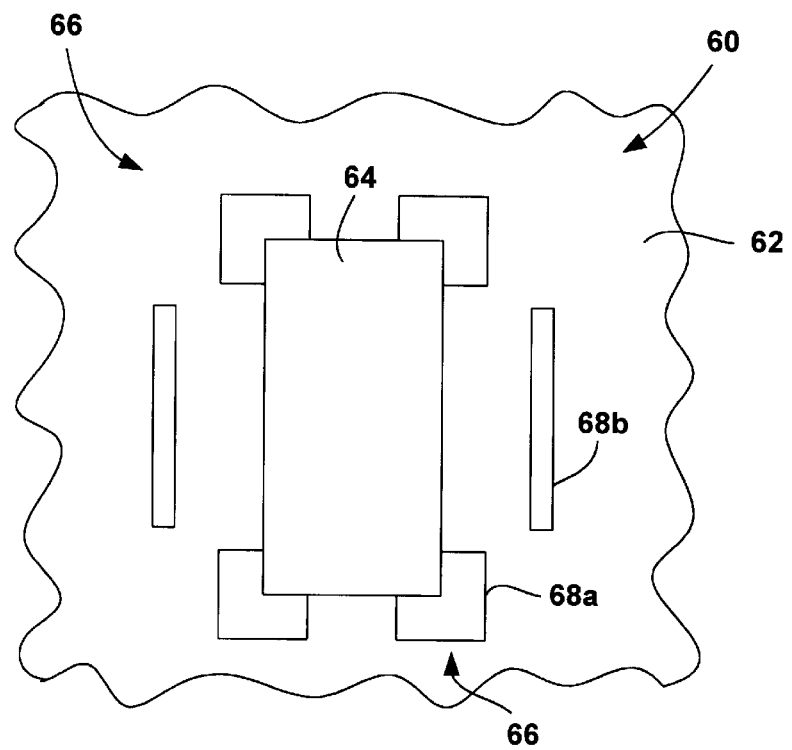
FIG. 5 is a fragmentary plan view of a feature employing an OPC design.
Figure 6:
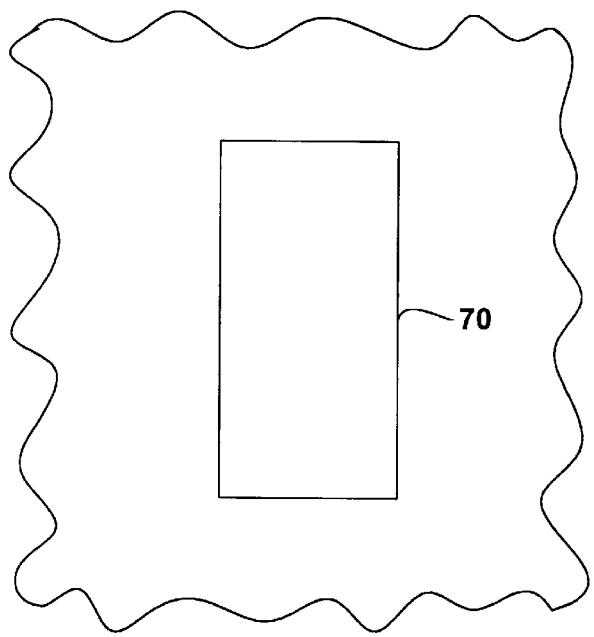
FIG. 6 is a fragmentary plan view of an ideal feature which corresponds to the feature of FIG. 5.
Figure 7:
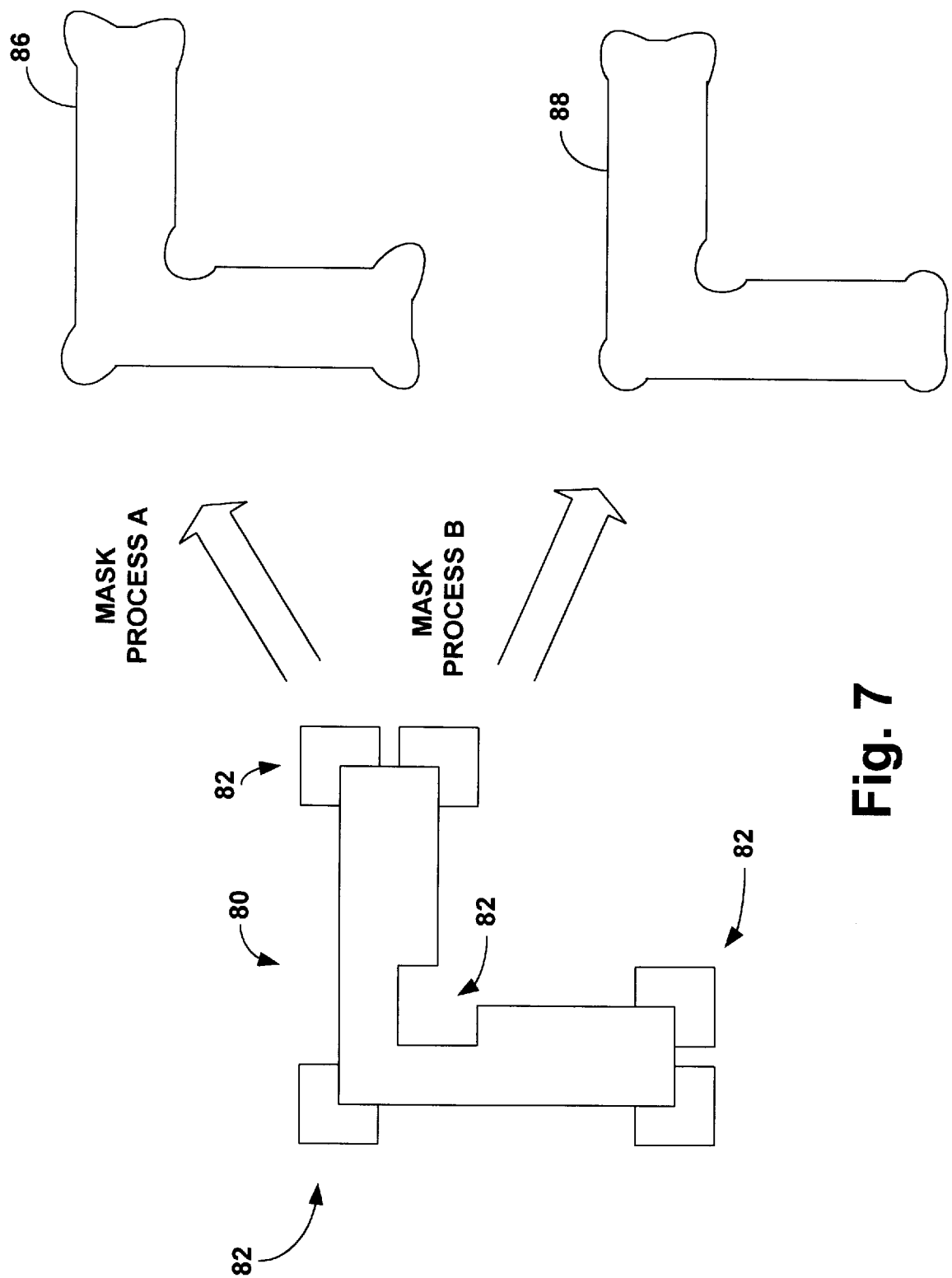
FIG. 7 is a plan view of mask layout data showing a mask pattern having optical proximity correction and two generated mask patterns which approximate an ideal mask pattern which were formed using different mask fabrication processes.

The following is a detailed description of the present invention made in conjunction with the attached Figures, wherein like reference numerals will refer to like elements throughout. The present invention relates to a system and method of characterizing features employing differing OPC designs. In addition, the present invention relates to a system and method for selecting an optimal mask fabrication process for a given mask pattern. In both cases, features, either the design features or the fabricated mask patterns, are subjected to a mathematical transformation. A metric which is related to a performance characteristic of a pattern transfer system is then applied to the transformed features to generate a value associated with each feature. The values are then used to characterize the various features according to predetermined criteria.

Figure 8:
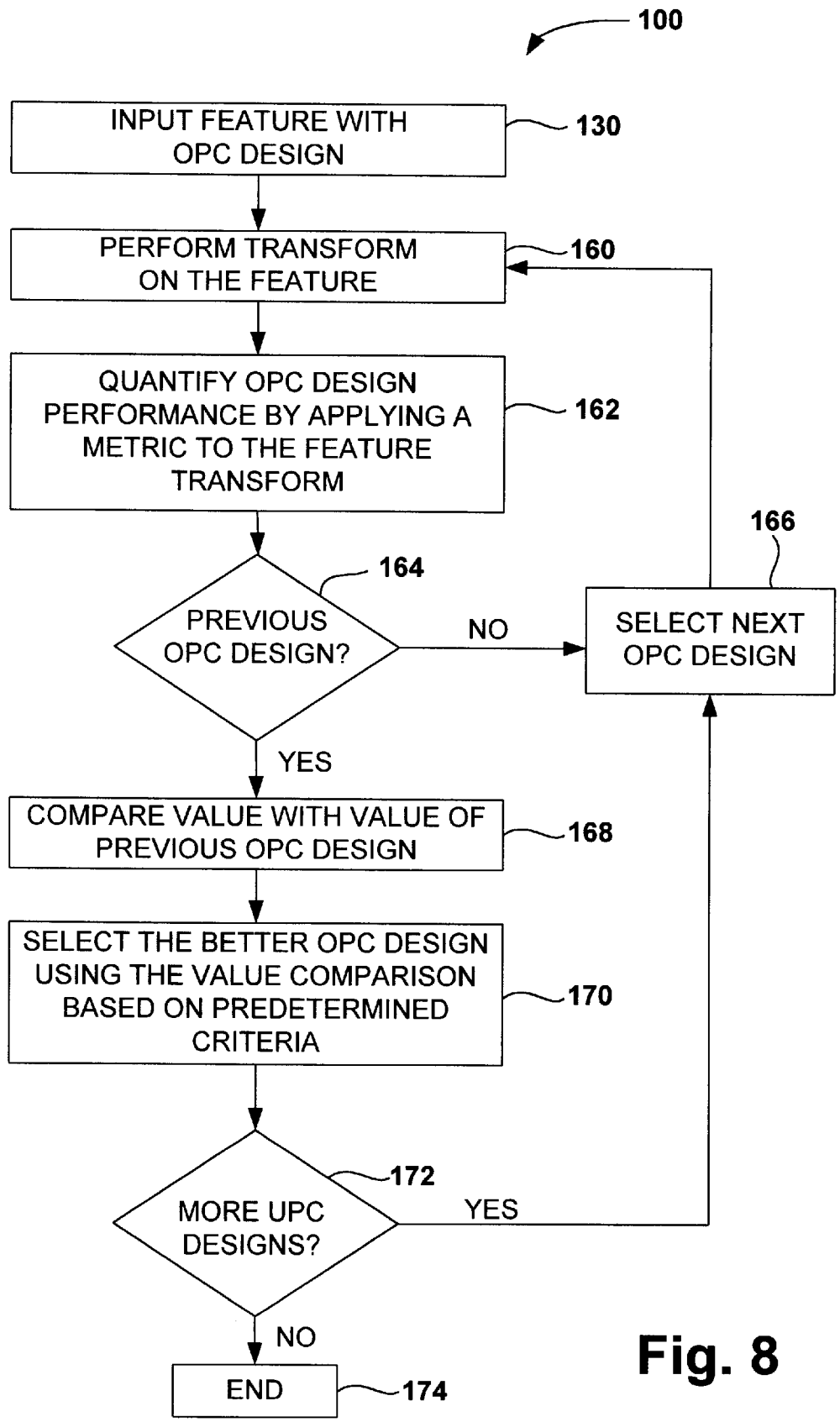
FIG. 8 is a flow chart diagram illustrating a method for establishing and using a metric which characterizes the pattern transfer system.
Figure 9:
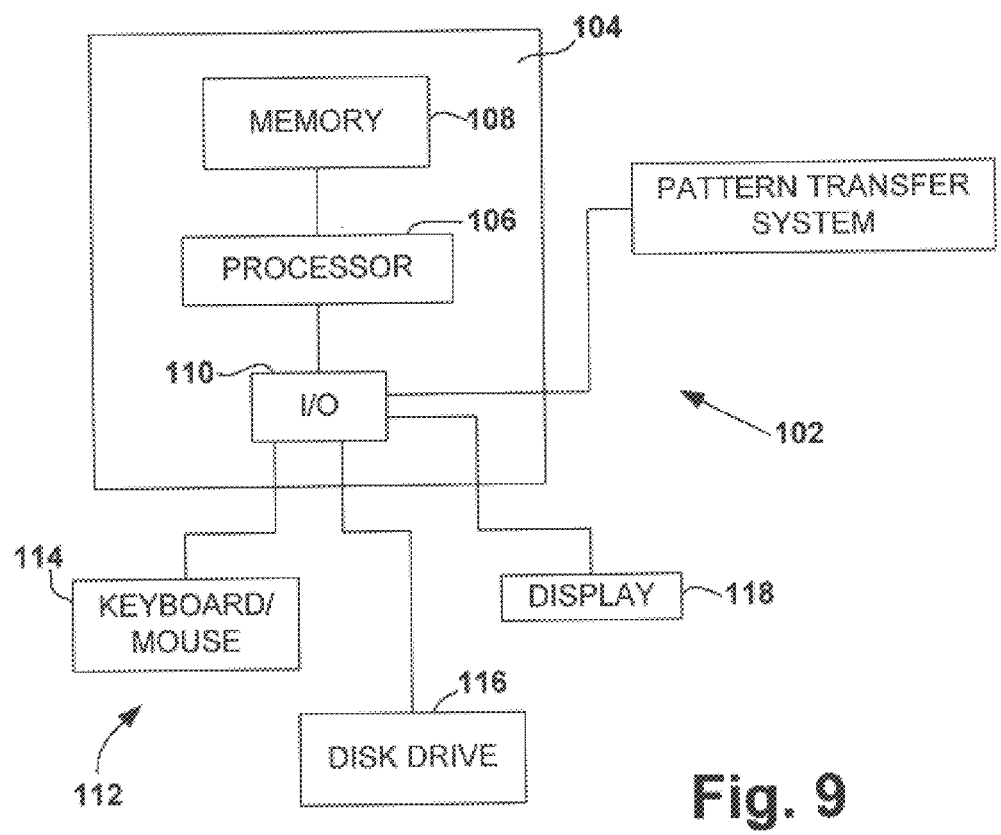
FIG. 9 is a block diagram illustrating a system for characterizing a plurality of optical proximity correction designs for a feature and for determining an optimal mask fabrication process according to the present invention.

Turning now to the Figures, FIGS. 8 and 9 illustrate a method and system of the present invention. FIG. 8 is a flow chart diagram illustrating a method 100 for characterizing a plurality of features which contain differing OPC designs. The method 100 of FIG. 8 will be discussed in conjunction with a preferred characterization system, as illustrated in FIG. 9, however, it should be understood that the method 100 of the present invention is not limited to any one particular system, but rather may be performed with any type of system, and such variations are contemplated as falling within the scope of the present invention.

A brief discussion of the system of FIG. 9 will first be discussed in order to more fully understand one exemplary manner in which the method 100 of FIG. 8 may be executed. FIG. 9 illustrates a system 102 for characterizing features having various OPC designs. The system 102 includes a computer 104 having a processor 106 with a memory 108 and an input/output (I/O) module 110 coupled thereto. Although the system 102 of FIG. 9 illustrates the memory 108 and the I/O module 110 as discrete components within the computer 104, the system 102 may alternatively integrate one or more of the components 108 and 110 with the processor 106, as may be desired.

In a typical operation, the processor 106 performs various mathematical and control functions based on its internal programming and may consist of any standard, commercially available processor. The memory 108 performs as a storage location for the processor 106 and may be accessed at various times by the processor 106, or alternatively may include read-only storage location for BIOS and/or other functions. Therefore the memory 108 includes any form of commercially available RAM and ROM memory. The I/O module 110 interfaces with the processor 106 and, under the control of the processor 106, interfaces with one or more input and output peripherals respectively.

The system 102 of FIG. 9 also preferably includes various types of peripheral devices which interface with the computer 104. For example, the system 102 includes an input device 112 which may include any form of data input hardware or software. For example, the input device 112 may include a manual input device such as a keyboard or mouse 114 to effectuate a manual input of data to the computer 104. In addition, or alternatively, the input device 112 may include a disk drive 116 to provide for the transmission of data to the computer 104 from portable storage media such as an optical or magnetic storage media. Still further, the input device 112 may include an input port for connection to a network, etc. for receipt of data to the computer 104.

The system 102 of FIG. 9 further includes an output device 118 which interfaces with the computer 104 via the I/O module 110 and provides output data to a user in any one of a variety of formats. Preferably, the output device 118 is a display which provides a visual representation of the output data in a variety of formats. Alternatively, however, the output device may be a printer or may be an output port for connection to a network, etc. for transmission of the output data to a remote location. Lastly, FIG. 9 illustrates the system 102 being connected to a pattern transfer system 120 (e.g., a photolithography system). This connection is optional and is provided to show that information related to a characteristic of the pattern transfer system 120 is pertinent to the present invention and will be transmitted to the computer 104 for processing. Preferably, however, the pattern transfer system 120 will be characterized separately and the data relating to its characterization will be transmitted to the computer 104 via the input device 112.

Returning now to the method 100 of FIG. 8, a plurality of input features are transmitted as input data to the system 102 at step 130. For example, step 130 may be carried out by transmitting the input data to the system 102 as a file from a storage media such as a disk or tape via the disk drive 116. The input data of step 130 corresponds to multiple features each having the same core portion and a unique OPC design applied thereto. The method 100 of the present invention characterizes each of the features to determine which of the OPC designs will provide the best feature resolution for a given pattern transfer system, as will be more fully understood in conjunction with the discussion below. An exemplary representation of a portion of the input data is illustrated in FIG. 10a.

Figure 10A:
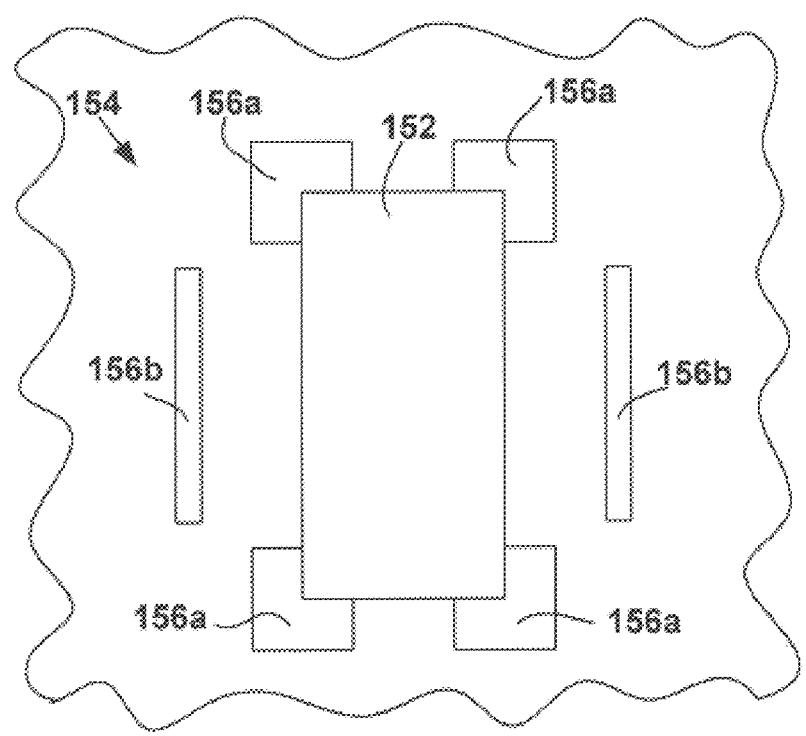
FIG. 10a is a fragmentary plan view of a portion of mask layout data illustrating a feature having a core portion and an optical proximity correction design applied thereto.

FIG. 10a is a fragmentary plan view illustrating mask layout data corresponding to a feature 150 having an OPC design applied thereto. The feature 150 includes a core portion 152 which corresponds to the ideal feature which is intended to be generated on a semiconductor substrate. In addition, the feature 150 includes an OPC design 154 which includes, for example, a plurality of serifs 156a, 156b which are provided to help overcome the undesirable diffractive effects discussed supra and thus generate a feature on the substrate which closely approximates the core portion 152. Note that although the feature 150 of FIG. 10a contains only additive-type serifs in this particular embodiment, other features may also include subtractive-type serifs or other type OPC structures, as may be desired.

The feature 150 can be characterized as a two-dimensional function g(x,y) as is well known by those skilled in the art. A Fourier transform is then performed on the input data at step 160. As is well known by those skilled in the art, a Fourier transform is often used in signal processing to convert a time-domain signal g(t) into an equivalent frequency-domain signal representation G(f). Such a transform is typically performed because a time-domain or time-amplitude representation of a signal is not always the best representation of the signal, and valuable substantive content can be derived from the frequency content or spectra. A Fourier transform thus provides the frequency spectrum of a signal and allows one to analyze which frequencies exist within the signal and a magnitude associated with each of the respective frequencies.

According to the present invention, the input data is not a time-domain signal, but rather is a spatial-domain signal g(x,y). That is, the feature 150 is characterized by its shape in the two-dimensional X-Y domain. Therefore when the feature 150 has a Fourier transform performed thereon at step 160, the spatial signal is converted into the two-dimensional spatial frequency domain G(f). The Fourier transform is performed on the feature 152 by the processor 106 according to its internal programming. The execution of the Fourier transform occurs according to the following formula:

$$G(f) = \int g(x,y) e^{-2\pi f t} dxdy.$$

The result of the Fourier transform is an infinite sum of periodic complex exponential functions. Since the exponential functions can be alternatively written in the form of (cos 2 πft+j sin 2 πft), the result is a sum of sine and cosine functions having various spatial frequencies, each having a coefficient which represents the strength of the feature at that particular spatial frequency. According to a preferred embodiment of the present invention, the resultant transform is multiplied by its complex conjugate to remove the complex component, which results in a power spectrum. Such a sum of functions can thus be represented in a two-dimensional spatial frequency mapping, as illustrated in FIG. 10b.

Figure 10B:
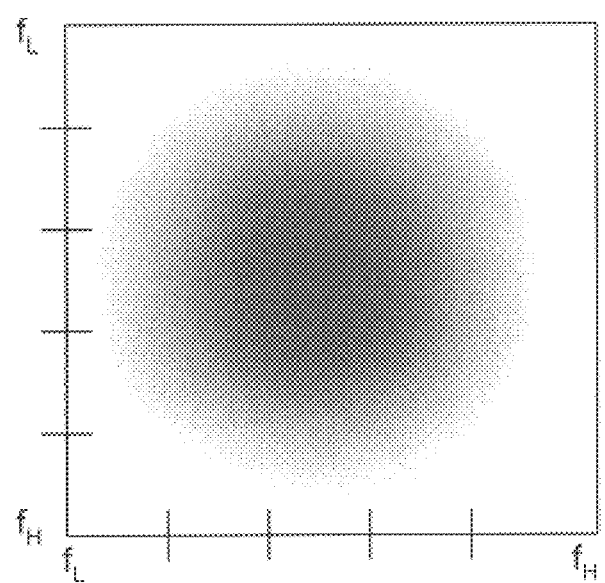
FIG. 10b is a graph illustrating a two-dimensional mapping of a power spectrum of a Fourier transform of the feature of FIG. 10a in the spatial frequency domain, wherein the two-dimensional mapping illustrates an energy distribution of the feature in the spatial frequency spectrum.

The two-dimensional spatial frequency mapping of FIG. 10b provides a graphical representation of the feature 152 in the spatial frequency domain. Therefore by analyzing the mapping or transformation components, one can determine the strength of the various spatial frequency coefficients. The two-dimensional mapping is preferably a color mapping which provides a color code related to the magnitude of the various coefficients, however, a gray scale may be used as shown in FIG. 10b, wherein the darkness at a particular point is related to the magnitude of the coefficient at that point. Since the coefficients are related to the energy of the feature, the spatial frequency mapping of FIG. 10b provides a visual representation of the energy distribution of the feature 152 about all the spatial frequencies.

After performing a Fourier transform on the feature 152 at step 160, the method continues at step 162 by quantitatively evaluating the feature 152 in the spatial frequency domain by applying a metric to the transformed feature data of FIG. 10b. The metric which is applied to the transformed feature data is a function of the pattern transfer system. Therefore the pattern transfer system which will be utilized in the formation of features using the characterized OPC designs must be itself characterized. It has been discovered that a pattern transfer system, due to its numerical aperture, illumination source, etc., behaves as a bandpass filter and therefore only passes the feature energy that falls within a selected band of spatial frequencies. Therefore a feature which has a significant amount of its feature energy at spatial frequencies that fall outside the spatial frequency band dictated by the pattern transfer system will exhibit poor feature resolution at the underlying substrate.

Figure 11:
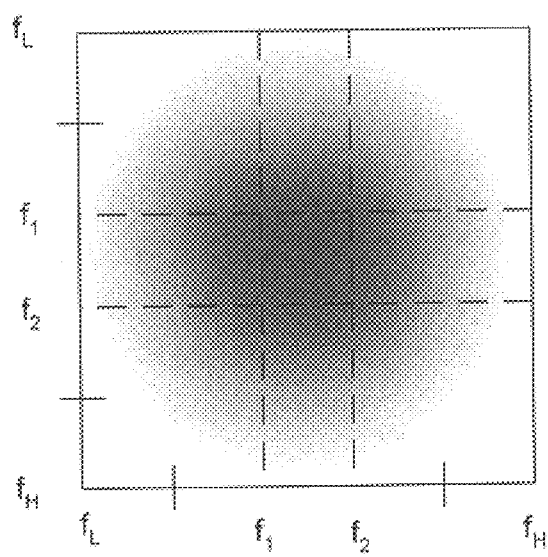
FIG. 11 is a graph illustrating an application of a metric to a two-dimensional mapping of a transformed feature, wherein the metric constitutes a range of spatial frequencies.

The metric, according to a preferred embodiment of the present invention, is therefore a range of spatial frequencies $(f_1-f_2)$ which will be transmitted through the pattern transfer system. The metric is obtained by characterizing the pattern transfer system (e.g., experimental or analytical). The metric is then transmitted to the system 102 via the input device 112, and is stored in the memory 108. At step 162, the metric is applied to the transformed feature data to obtain a value which characterizes the feature 152 (and thus helps evaluate the quality of the OPC design applied thereto). Preferably, the value corresponds to the amount of feature energy that falls within the range of spatial frequencies $(f_1-f_2)$ and is determined by the processor 106 by integrating the transformed feature data (i.e., the sum or product of functions) over the spatial frequency range. The application of an exemplary metric (step 162) by the processor 106 is illustrated graphically in FIG. 11. The value associated with the feature 152 is then saved by the processor 106 in the memory 108 and the result may, if desired, be displayed via the output device 118.

Figure 10C:
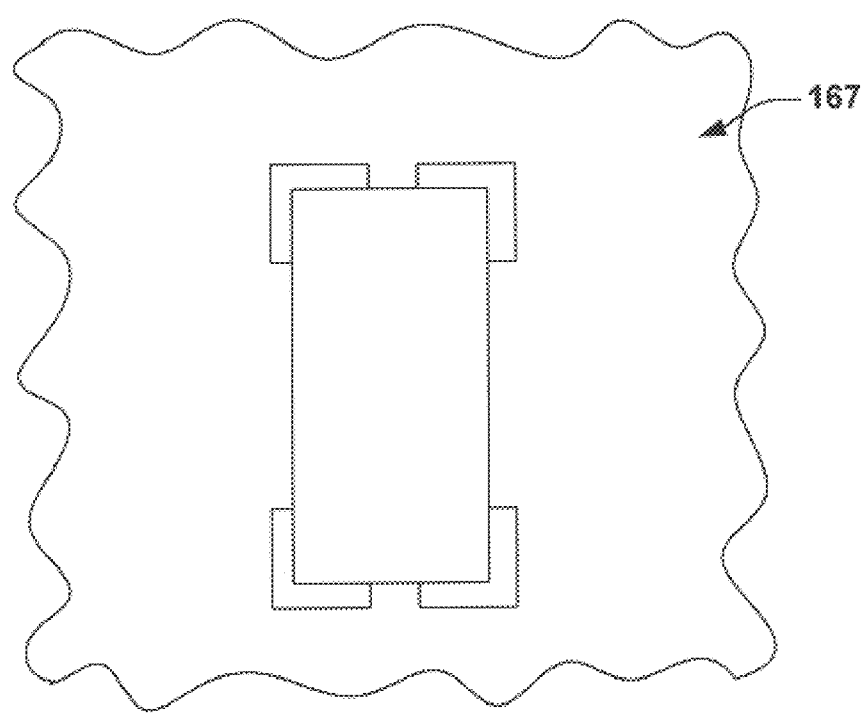
FIG. 10c is a fragmentary plan view of a portion of mask layout data illustrating a feature having a core portion without any optical proximity correction.
Figure 10D:
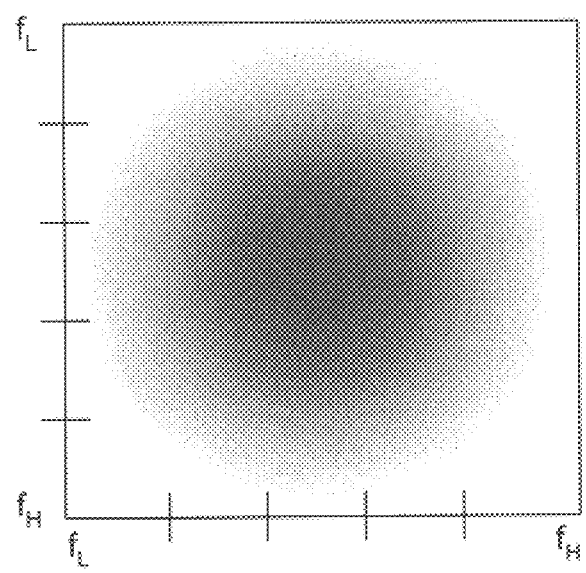
FIG. 10d is a graph illustrating a two-dimensional mapping of a power spectrum of a Fourier transform of the feature of FIG. 10c in the spatial frequency domain, wherein the two-dimensional mapping illustrates an energy distribution of the feature in the spatial frequency spectrum.

The method 100 then continues at step 164 and determines whether other features having differing OPC designs had previously been characterized. If no such data exists (NO), then steps 160 and 162 were associated with the first feature in the input data set and the next OPC design which is applied to a core portion 154 to create another feature is selected from the input data set at step 166. The method 100 then continues by returning to step 160 and performing a Fourier transform on the next feature. As an example, FIGS. 10c and 10d illustrate another feature 167 having a different OPC design applied thereto and its corresponding two-dimensional spatial frequency mapping. Steps 160 and 162 are repeated and since a previous OPC design has now been evaluated, the determination at step 164 is in the affirmative (YES), and the method 100 continues to step 168.

At step 168, a comparison is made by the processor 106 between the calculated values associated with the two features and the processor 106 selects one of the features at step 170 using the values based on a predetermined criteria stored therein. According to a preferred embodiment of the present invention, the predetermined criteria is a selection of the feature having a greater value as calculated by the processor 106. As discussed supra, when using a Fourier transform, the transformed feature data provides a representation of the power spectrum of the feature. Therefore a feature having a greater value has a larger amount of the feature energy within the range of spatial frequencies that will be transmitted through the pattern transfer system and therefore will provide better feature resolution at the substrate than the other feature having a lesser value.

After the processor 106 selects one of the features having a unique OPC design over the other based on the application of the predetermined criteria to the calculated values, the processor 106 determines whether other features having unique OPC designs still exist within the input data set for characterization at step 172. If more features exist (YES), the processor 106 selects the next feature in the input data set at step 166 and continues the process of steps 160–172 until all the features having unique OPC designs have been characterized at step 172 (NO), at which point the method 100 ends at step 174.

The method 100 of FIG. 8 is preferably performed using a Fourier transform according to the programming of the processor 106 because the Fourier transform is well understood and the pattern transfer system can be readily characterized as a bandpass filter in the spatial frequency domain. Alternatively, however, other types of mathematical transforms may be used such as a Hilbert transform, a Wigner distribution, a Radon transform, a Wavelet transform, etc. and any such mathematical transform is contemplated as falling within the scope of the present invention. A brief discussion follows below which illustrates how a Wavelet transform can be utilized to characterize various features in accordance with the present invention. A Wavelet transform for a given function g(x,y) may be computed as follows:

$$\Psi(\tau,s)=(1/s^{1/2})\int g(x,y)\psi^*[(x,y-\tau)/s]dxdy.$$

As can be seen from the above equation, the transformed feature is a function of two variables, $\tau$ and s, wherein $\tau$ is related to a translation parameter and s corresponds to a scale parameter. $\psi^*$ is the transforming function and is often called the mother wavelet. The transformed feature data $\Psi(\tau,s)$ is thus a finite sum or product of translated and scaled functions. One reason the Wavelet transform is sometimes preferred over the Fourier transform is that the transformed data is a finite sum of functions with coefficients that quickly decrease to zero, whereas the Fourier transform results in an infinite sum of sine/cosine functions. Therefore the Wavelet transform finds many applications in data compression, etc.

According to the present invention, the processor 106 takes the various features g(x,y) in the input data set and performs a Wavelet transform thereon according to its internal programming to provide transformed feature data for each feature of the form $\Psi(\tau,s)=\alpha_1\psi_1(\tau,s)+\alpha_2\psi_2(\tau,s)+\alpha_3\psi_3(\tau,s)+\ldots$, wherein the coefficients $\alpha_1, \alpha_2, \alpha_3 \ldots$ quickly decrease to zero (typically within three to four coefficients). Therefore the transformed feature data corresponding to each feature having a unique OPC design are compact, finite sums of functions.

According to the method 100 of FIG. 8, the processor 106 quantitatively evaluates each transformed feature by applying a metric thereto which is related to or corresponds with a performance characteristic of the pattern transfer system. Preferably, a suitable metric is obtained by experimentation by evaluating how various OPC designs perform in generating a feature on a substrate using the pattern transfer system and then, using that information, establishing a correlation between the performance and the transformed feature data. For example, it may be found via experimentation that for a given pattern transfer system, a magnitude of the transformed feature vector strongly correlates to good feature resolution. In such an instance, a function of the transformed feature sum is chosen as the metric (ie., the feature vector magnitude $[\alpha_1^2+\alpha_2^2+\alpha_3^2+ \ldots ]^{1/2}$) and is applied by the processor 106 to obtain a value for each of the features. Alternatively, an analytical model may be used to establish a metric.

The method 100 then continues by comparing the values of the various features and selecting one of the features as the best according to a predetermined criteria. For example, if the correlation which was found was that a good feature resolution correlates with a small transformed feature vector magnitude, the predetermined criteria used by the processor 106 will be to select the feature having the smallest calculated value. Conversely, if the correlation was that a good feature resolution correlates with a large transformed feature vector magnitude, the predetermined criteria used by the processor 106 will be to select the feature having the largest calculated value.

As discussed supra, a feature having the optimal OPC design may be determined by evaluating a mathematical transform and applying a metric thereto. Once such a feature with the optimal OPC design is selected, however, it is desirable to produce that feature having OPC on a mask as accurately as possible in order to obtain the full benefit of the optimized OPC design. According to another embodiment of the present invention, a method of selecting an optimal mask fabrication process is disclosed in order to fabricate mask patterns which most closely approximate the feature having the OPC design.

Figure 12:
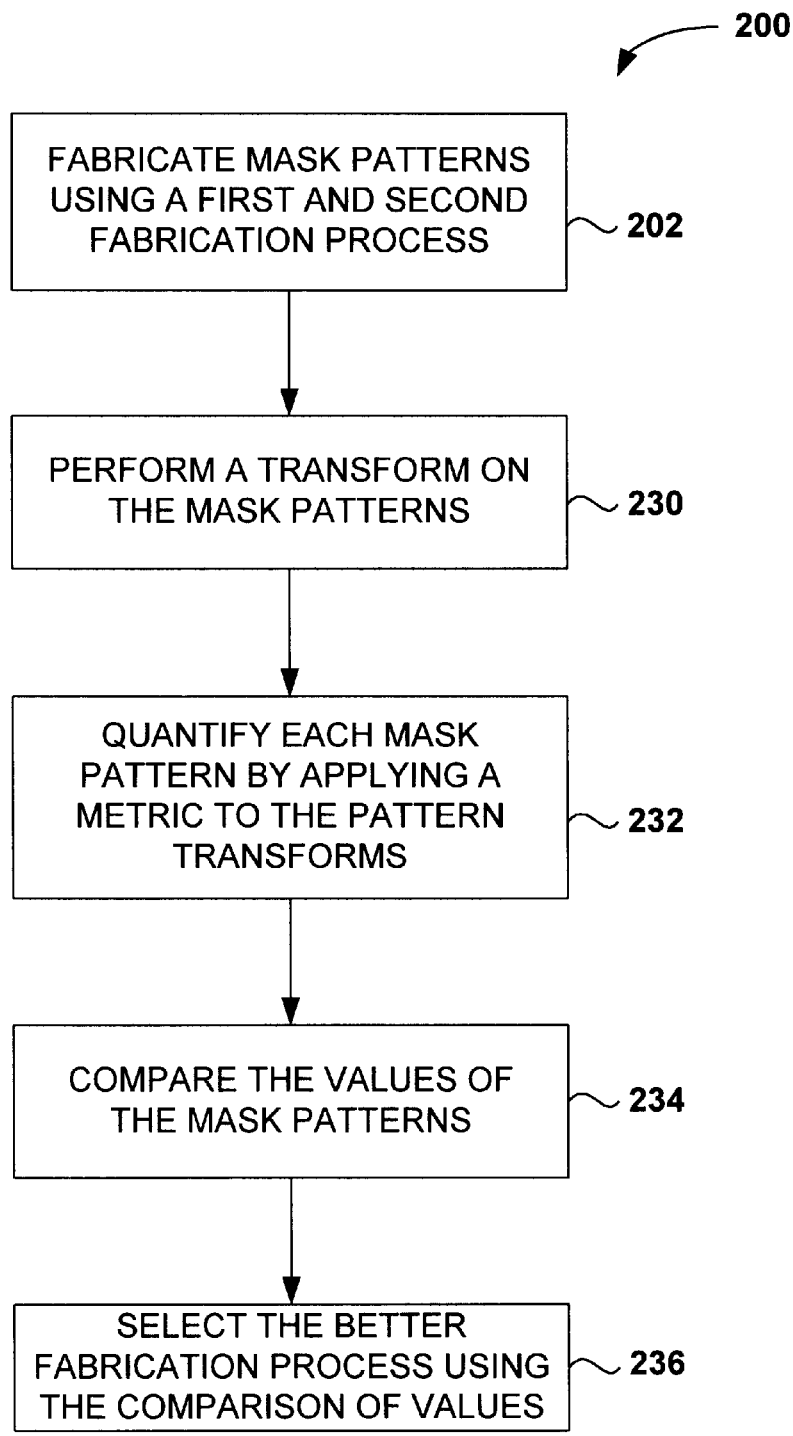
FIG. 12 is a flow chart diagram illustrating a method of determining an optimal mask fabrication process according to the present invention.

A method 200 for determining the optimal mask fabrication process is illustrated in FIG. 12. The method 200 begins at step 202 with the fabrication of mask patterns using different mask fabrication processes. As is well known by those skilled in the art, different types of mask processes will generate mask patterns that will differ from one another although they each approximate the intended feature. The differences between the mask patterns may be a function of various factors, for example, the type of etch (e.g., wet or dry) used to delineate the patterns, the etch chemistry, the mask pattern material (e.g., chrome), the type of photoresist, etc.

Figure 13:
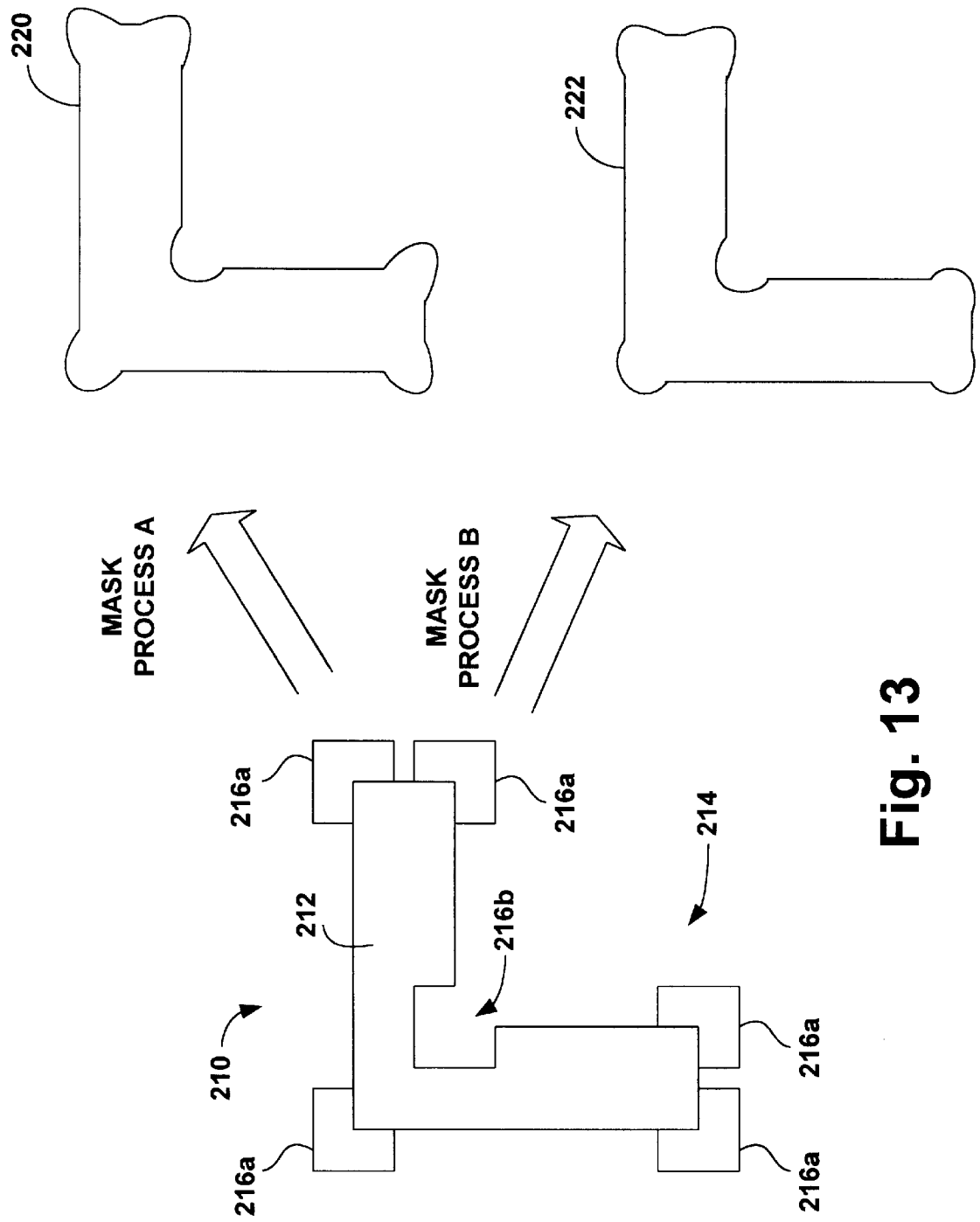
FIG. 13 is a plan view of mask layout data showing a mask pattern having optical proximity correction and two generated mask patterns which approximate an ideal mask pattern which were formed using different mask fabrication processes.

FIG. 13 illustrates a feature 210 having a core portion 212 and an OPC design 214 composed of serifs 216a and 216b. As illustrated in FIG. 13, a first mask fabrication process A results in a first mask pattern 220 while a second mask fabrication process B results in a second mask pattern 222, wherein both mask patterns 220 and 222 approximate the feature 210. The mask patterns 220 and 222 are then imaged and converted into a set of input data (e.g., via bit-mapping, tiling, polygonal approximation, etc.).

Figure 14:
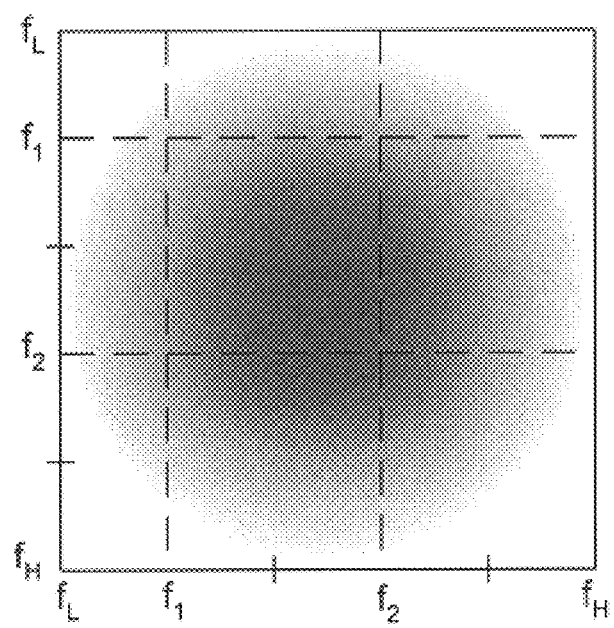
FIG. 14 is a graph which illustrates a transformed two-dimensional mapping of a mask pattern formed with a mask fabrication process.
Figure 15:
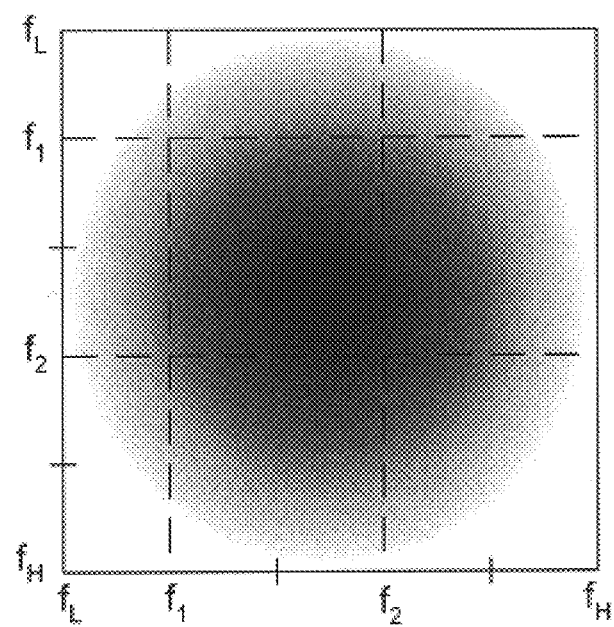
FIG. 15 is a graph which illustrates a transformed two-dimensional mapping of another mask pattern formed with a mask fabrication process which differs from the process of FIG. 14.

The input data set is transferred, for example, to the system 102 of FIG. 9 and the processor 106, according to its internal programming, performs a Fourier transform on each set of mask pattern data at step 230. Upon multiplying the result by its complex conjugate, the complex components are removed and the result is the power spectrum. The result of the Fourier transforms is a two-dimensional spatial frequency mapping for each mask pattern, as illustrated in FIGS. 14 and 15. The method 200 continues at step 232, wherein the processor 106 quantitatively characterizes the mask patterns 220 and 22 by applying a metric to the transformed mask pattern data, wherein the metric is related to a characteristic of the pattern transfer system which will ultimately employ the masks containing the mask patterns. For example, the metric, is preferably a range of spatial frequencies ($f_1-f_2$) that will be transmitted through the pattern transfer system. The application of the metric to each of the mappings of FIGS. 14 and 15 result in a value associated with each mask pattern.

Figure 16:
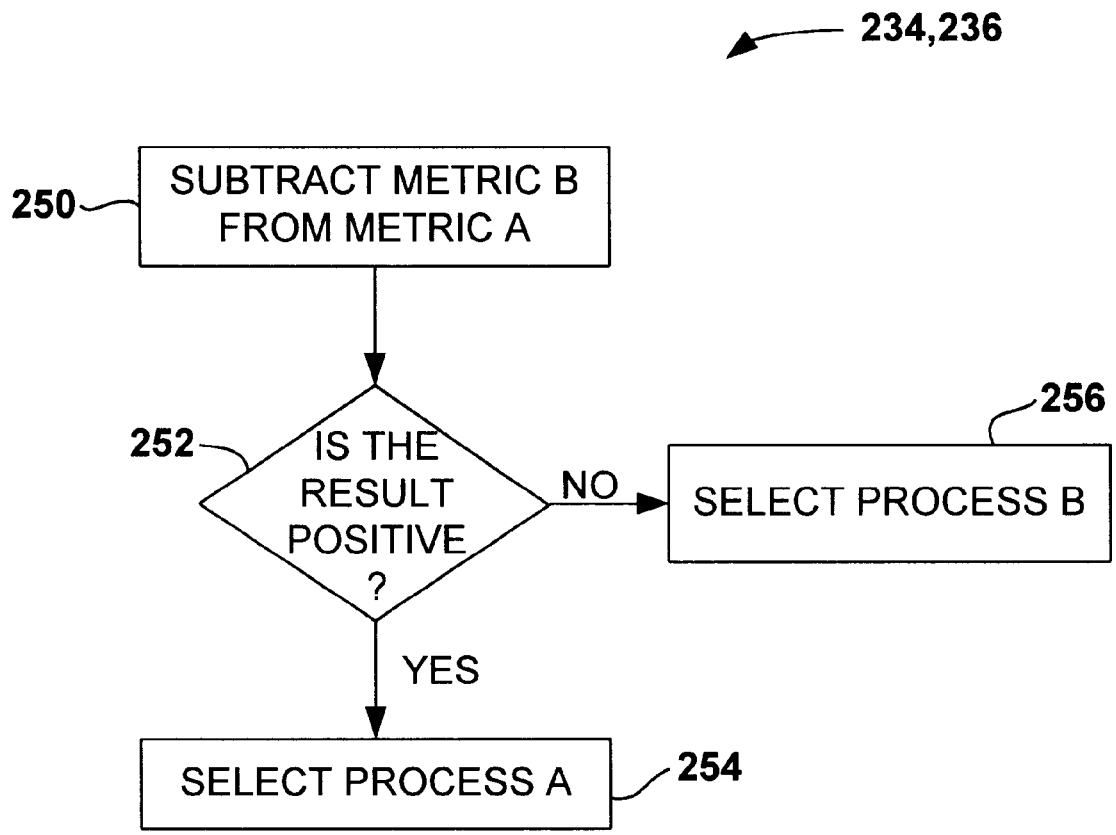
FIG. 16 is a flow chart diagram illustrating a method of selecting one mask fabrication process over another using values associated with the mask patterns according to the present invention.

The method 200 continues at step 234, wherein the processor 106 compares the values associated with each of the mask patterns and then selects one of the mask patterns at step 236 using the comparison of step 234 according to a predetermined criteria. According to a preferred embodiment of the present invention, the processor 106 selects the mask pattern having the larger value since a larger value represents a greater amount of mask pattern energy within the range of spatial frequencies which will be transmitted through the pattern transfer system, as illustrated in FIG. 16. As shown, one exemplary method of making such a selection is to subtract the value of the mask pattern associated with mask fabrication process B from the value of the mask pattern associated with mask fabrication process A (step 250). If the result is positive (YES at step 252), the processor 106 selects mask fabrication process A (step 254) and if the result is negative (NO at step 252), the processor 106 selects mask fabrication process B. Although the method 200 of FIG. 12 is disclosed with respect to only two different mask fabrication processes, the method 200 extends to the characterization of multiple processes by repeating the steps, as may be desired. In the above manner, an optimal mask fabrication process can be selected in order to obtain the full benefit of an OPC design, thus providing improved feature resolution on a substrate.

Although the above method 200 has been discussed with respect to the use of a Fourier transform, the present invention applies to use of any type of mathematical transform, such as a Hilbert transform, a Wigner distribution, a Radon transform, a Wavelet transform, etc. Any such mathematical transform is contemplated as falling within the scope of the present invention. According to one exemplary embodiment of the present invention, the processor 106 takes the various mask patterns g(x,y) in the input data set and performs a Wavelet transform thereon according to its internal programming to provide transformed feature data of the form $\Psi(\tau,s)=\alpha_1\psi_1(\tau,s)+\alpha_2\psi_2(\tau,s)+\alpha_3\psi_3(\tau,s)+ \ldots$, wherein the coefficients $\alpha_1, \alpha_2, \alpha_3 \ldots$ quickly decrease to zero (typically within three to four coefficients). Therefore the transformed mask pattern data corresponding to each mask pattern having a unique mask fabrication process are compact, finite sums of functions.

According to the method 200 of FIG. 12, the processor 106 quantitatively evaluates each transformed mask pattern by applying a metric thereto which is related to or corresponds with a performance characteristic of the pattern transfer system. Preferably, a suitable metric is obtained by experimentation by evaluating how various mask patterns made by differing mask fabrication techniques performed in generating a feature on a substrate using the pattern transfer system and then, using that information, identifying a correlation between the performance and the transformed mask pattern data. For example, it may be found via experimentation that for a given pattern transfer system, a magnitude of the transformed mask pattern vector strongly correlates to good feature resolution. In such an instance, a function of the transformed mask pattern sum is chosen as the metric (i.e., $[\alpha_1^2+\alpha_2^2+\alpha_3^2+ \ldots ]^{1/2}$) and applied by the processor 106 to obtain a value for each of the mask patterns.

The method 200 then continues by comparing the values of the various mask patterns and selecting one of the mask patterns as the best according to a predetermined criteria. For example, if the correlation which was found was that a good feature resolution correlates with a small transformed mask pattern vector magnitude, the predetermined criteria used by the processor 106 will be to select the mask pattern having the smallest value. Conversely, if the correlation was that a good feature resolution correlates with a large transformed mask pattern vector magnitude, the predetermined criteria used by the processor 106 will be to select the mask pattern having the largest value.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of determining an optimal mask fabrication process, comprising the steps of:
    fabricating a first mask pattern on a mask using a first mask fabrication process, wherein the first mask pattern provides a pattern on a substrate which approximates an ideal pattern;
    performing a mathematical transform on the first mask pattern, wherein the mathematical transform provides a representation of the first mask pattern as a first sum or product of functions;
    fabricating a second mask pattern on a mask using a second mask fabrication process, wherein the second mask pattern provides a pattern on a substrate which approximates the ideal pattern;
    performing a mathematical transform on the second mask pattern, wherein the mathematical transform provides a representation of the second mask pattern as a second sum or product of functions;
    obtaining a metric for the transformed mask patterns, wherein the metric is based upon a capability of a pattern transfer system which will utilize the masks employing the first and second mask patterns, respectively; and
    selecting the first mask fabrication process or the second mask fabrication process based upon an application of the metric to the first and second sum or product of functions, thereby selecting the one of the first or second mask fabrication process that provides for a better mask pattern which most closely approximates the ideal mask pattern.

2. The method of claim 1, wherein the mathematical transform comprises a Fourier transform which transforms the first and second mask patterns into two-dimensional mappings which represent a distribution of energy over a plurality of spatial frequencies in Fourier space.

3. The method of claim 2, wherein the metric comprises an area on the two-dimensional mappings which correspond to a predetermined range of spatial frequencies, and wherein the energy within the area represents the energy within the predetermined range of spatial frequencies which will be transmitted through the pattern transfer system.

4. The method of claim 3, wherein applying the metric comprises integrating the Fourier transforms of the first feature and the second feature over the area.

5. The method of claim 1, wherein the selecting of one of the first mask fabrication process or the second mask fabrication process comprises applying the metric to the transformed first and second mask patterns to generate first and second values, and selecting the mask fabrication process which has a larger value than the other, wherein the larger value represents a more efficient transfer of energy by the pattern transfer system to the substrate.

6. The method of claim 1, wherein the mathematical transform comprises a Wavelet transform which transforms the first and second mask patterns into a finite sum or product of translated and/or scaled functions.

7. The method of claim 6, wherein the metric comprises a function of one or more coefficients of the functions obtained by the Wavelet transforms of the first and second mask patterns, respectively.

8. The method of claim 7, wherein the selecting of one of the first mask fabrication process or the second mask fabrication process comprises comparing a value of the metric function of the first and second transformed mask patterns, and selecting the first mask fabrication process or the second mask fabrication process using the value based on a predetermined criteria.

9. The method of claim 1, further comprising the steps of:
    (a) performing a mathematical transform on another mask pattern formed using another mask fabrication process;
    (b) applying the metric to the transformed another mask pattern to thereby generate a value corresponding to the another transformed mask pattern;
    (c) comparing the value of the another transformed mask pattern to the value of the previously selected mask fabrication process;
    (d) selecting the another mask fabrication process or the previously selected mask fabrication process using the values based on the predetermined criteria;
    (e) repeating steps (a)–(d) until all the mask fabrication processes of interest have been characterized, and wherein the mask fabrication process selected in step (d) provides a best mask pattern transfer compared to the other mask fabrication processes.

10. The method of claim 1, wherein the mask fabrication processes include an etch variable which may be varied.

11. The method of claim 1, wherein the mask fabrication processes include a resist-type variable which may be varied.

12. A system for determining an optimal mask fabrication process, comprising:
    an input device which receives input data corresponding to a plurality of mask patterns that each approximate an ideal mask pattern, wherein the mask patterns are formed by different mask fabrication processes, and wherein the input device transmits the input data to the system, and wherein the input data represents a two-dimensional data representation of the plurality of mask patterns;
    a processor coupled to the input device, wherein the processor receives the input data from the input device and performs a Fourier transform thereon, and wherein the Fourier transform provides a two-dimensional mapping of spatial frequencies for each of the plurality of mask patterns; and a memory coupled to the processor, wherein the memory stores a metric which is based upon a capability of a pattern transfer system which will utilize one or more masks employing the plurality of mask patterns thereon, and wherein the processor accesses the memory to utilize the metric in evaluating the plurality of transformed mask patterns, wherein the metric represents a selected range of spatial frequencies which the pattern transfer system is capable of transmitting therethrough, and wherein the processor is programmed to apply the metric to the two-dimensional mapping of spatial frequencies for the plurality of mask features by integrating the two-dimensional mappings of the mask patterns over the selected range of spatial frequencies, and wherein the result of the integration is a value which indicates an amount of energy associated with the respective mask pattern which is transmitted through the pattern transfer system to the substrate, and wherein the processor selects one of the mask fabrication processes by selecting its associated mask pattern using the metric based upon a predetermined criteria, wherein using the metric comprises selecting the mask fabrication process associated with the mask pattern having the largest amount of energy within the selected range of spatial frequencies.

13. The system of claim 12, further comprising an output device coupled to the processor, wherein the output device receives output data from the processor and provides a representation of the output data for review and analysis.

14. The system of claim 13, wherein the output device comprises a printer and/or a display.

15. The system of claim 13, wherein the output data comprises one or more of the selection of one of the mask fabrication processes, a representation of the transformed mask patterns, a representation of the metric applied to the representation of the transformed mask patterns, and a value associated with the application of the metric to the transformed mask patterns.

16. The system of claim 15, wherein the representation of the transformed mask patterns and the representation of the metric are graphical representations.

17. The system of claim 12, wherein the input device comprises a keyboard or mouse for data entry or a disk drive for transmitting the input data from a portable storage media to the processor.

18. A system for determining an optimal mask fabrication process, comprising;

an input device which receives input data corresponding to a plurality of mask patterns that each approximate an ideal mask pattern, wherein the mask patterns are formed by different mask fabrication processes, and wherein the input device transmits the input data to the system, and wherein the input data represents a two-dimensional data representation of the plurality of mask patterns;

a processor coupled to the input device wherein the processor is programmed to perform a Wavelet transform on the input data to form a sum or product of finite, scaled and translated functions for each of the plurality of mask patterns; and a memory coupled to the processor, wherein the memory stores a metric which is based upon a capability of a pattern transfer system which will utilize one or more masks employing the plurality of mask patterns thereon, and wherein the processor accesses the memory to utilize the metric in evaluating the plurality of transformed mask patterns, wherein the processor selects one of the mask fabrication processes by selecting its associated mask pattern using the metric based upon a predetermined criteria.

19. The system of claim 18, wherein the metric represents a predetermined function of one or more coefficients of the transformed mask patterns, and wherein the processor is programmed to apply the metric to the transformed mask patterns to generate a value associated with each of the mask patterns, and wherein the processor is programmed to select one of the mask patterns and its associated mask fabrication process using the value based upon a predetermined criteria.

* * * * *

UNITED STATES PATENT AND TRADEMARK OFFICE
CERTIFICATE OF CORRECTION

PATENT NO.: 6,187,483

DATED: February 13, 2001

INVENTOR(S): Luigi Capodieci
Christopher A. Spence

It is certified that error appears in the above-identified patent and that said Letters Patent is hereby corrected as shown below:

Column 2, line 20, please replace the word "comers" with the word --corners--.

Column 4, line 21, please replace the word "character" with the word -- characterized--.

Signed and Sealed this

Twenty-ninth Day of May, 2001

Attest:

NICHOLAS P. GODICI

*Attesting Officer*   *Acting Director of the United States Patent and Trademark Office*